United States Patent [19]
Cavasin

[11] Patent Number: 5,800,747
[45] Date of Patent: Sep. 1, 1998

[54] METHOD FOR MOLDING USING AN ION IMPLANTED MOLD

[75] Inventor: Daniel Cavasin, Austin, Tex.

[73] Assignee: Motorola, Inc., Schaumburg, Ill.

[21] Appl. No.: 674,379

[22] Filed: Jul. 2, 1996

[51] Int. Cl.$^6$ .................... B29C 33/56; B29C 45/02; B29C 70/70

[52] U.S. Cl. .................. 264/39; 264/272.17; 264/338; 249/135; 425/116; 425/544

[58] Field of Search .................... 249/135; 264/39, 264/337, 338, 272.15, 272.17; 425/544, 116

[56] References Cited

U.S. PATENT DOCUMENTS

| | | | |
|---|---|---|---|
| 4,793,792 | 12/1988 | Akino | 425/385 |
| 5,151,276 | 9/1992 | Sato et al. | 264/134 |
| 5,266,832 | 11/1993 | Yamamoto et al. | 257/629 |

FOREIGN PATENT DOCUMENTS

| | | | |
|---|---|---|---|
| 1-293523 | 11/1989 | Japan | 425/544 |
| 1-299008 | 12/1989 | Japan | 425/117 |

OTHER PUBLICATIONS

G. K. Hubler, "DoD Applications of Implantation–Modified Materials", Elsevier Science Publishing Co., Inc., pp. 341–355 (1982).

F. G. Yost, et al. "Friction and Wear of Stainless Steels Implanted with Ti and C*", Elsevier Science Publishing Co., Inc. pp. 261–269 (1982).

*Primary Examiner*—Angela Ortiz
*Attorney, Agent, or Firm*—J. Gustav Larson; Patricia S. Goddard

[57] ABSTRACT

A mold tool (40) includes a lower platen (10) and an upper platen (18) which have modified surfaces (16) and (20), respectively. The modified surfaces are formed by implanting an implant species (14) at least into areas of the platens which will be in contact with a molding compound resin. By modifying the surface of the molding tool by ion implantation, the need for cleaning the mold tool is reduced due to lower surface friction and wettability of the modified surfaces. These surface characteristics also facilitate easier release of the molded package from the tool. At the same time, wear resistance of the mold tool is improved due to increased surface hardness.

15 Claims, 2 Drawing Sheets

METHOD FOR MOLDING USING AN ION IMPLANTED MOLD

FIELD OF INVENTION

The present invention relates to molding in general, and more specifically to method for molding semiconductor devices using resins.

BACKGROUND OF INVENTION

One of the most common methods for packaging a semiconductor device is to mold the device with a resin molding compound. In a common transfer molding operation, a mold tool having a cavity is provided which has a plurality of package cavities, a plurality of gate cavities, and a plurality of runner cavities defined therein connected to at least one pot. Semiconductor devices are placed within the package cavities, which are filled with a resin based compound which generally has been transferred from a centralized portion of the mold through the runner cavities to the package cavities where a final package is created. After the compound has set for a specified amount of time, the devices are withdrawn from the mold tool, and the process is repeated for new devices.

Overall, the molding operation can be considered to be rather quick. One molding cycle, which may encapsulate anywhere from 4 to 80 devices at one time, generally occurs within 30 to 180 seconds with the use of automolds. Unfortunately, the molding process is slowed by the need to clean the molds periodically to remove surface contamination. The resins used to form the molded packaged bodies leave behind contamination on the surfaces of the mold tool, which over time build up to unacceptable levels. Such contamination can impede the molding process, leading to incomplete filling or voiding, or can affect the visual appearance of the package being molded. Accordingly, a semiconductor manufacturer must clean the mold periodically. In a manufacturing environment, it is estimated a cleaning needs to occur approximately once a shift, or about once every 7 to 8 hours. A problem with the cleaning operation is that it results in significant down time of the molding tools which could otherwise be used for manufacturing semiconductor devices. In cleaning a tool, the tool is out of production for anywhere from 1 to 4 hours depending upon the degree of cleaning. Various cleaning techniques might be used, including the use of physically cleaning the molding tool with a brush along with a solvent or surfactant to remove contamination of the mold tool surface. Another cleaning technique is the use of melamine shots, where in place of the molding compound resin, a melamine resin is transferred through the molding tool. The melamine resin absorbs surface contaminates while simultaneously conditioning the mold tool surface. Despite the effectiveness of these cleaning operations, a need exists for minimizing the number of cleaning cycles required so that the molding tools can be used for production purposes.

Apart from the need for cleaning, another problem with mold tools used in the manufacture of plastic encapsulated semiconductor devices is the wear of the tools over time. Resin molding compounds used to encapsulate semiconductor devices typically use filler materials. Filler materials are used for a variety of reasons including enhancing the semiconductor package integrity, improving heat transfer through the semiconductor package, and controlling the coefficient of thermal expansion within the packaged semiconductor device. Despite the different purposes of using fillers, all fillers have one common characteristic. All are abrasive to the mold tool. As such, transfer of resin molding compounds through runners, gates and packaged cavities of molding tools leads to an erosion or wearing of the mold tool surface, thereby shortening the useful lifetime of the mold tool. As semiconductor devices performance requirements excel, the need for fillers in the resin molding compound increases, and the type of fillers needed tend to be more abrasive than those used in the past. For example, aluminum nitride and boron nitride are fillers which are being incorporated into resin molding compounds to aid in heat transfer in plastic encapsulated semiconductor devices. However, aluminum nitride and boron nitride are much harder than traditional silica fillers and therefore tend to abrade the mold tool surfaces more quickly. Therefore, there is a need for a semiconductor molding operation which is more resistant to wear.

One attempt to solve the aforementioned problems of cleaning and wearing of the mold tools surfaces has been the use of chemically deposited films which coat the mold tool surfaces. For example, titanium nitride has been deposited by chemical vapor deposition to form a titanium nitride coating to increase the wearability of the mold tool surface. However, a problem with the use of such coatings is that the coating affects the final dimension of the mold cavity. Thus, when the mold tool is initially machined, the thickness and uniformity of the subsequent coating must be taken into account. A second problem with the use of such coatings is that they are susceptible to delamination. As with any coating, there is a risk that the film will peel from the underlying material. This is of particular concern in the molding of semiconductor devices, where plastic is introduced at the package cavity under very high pressures which would require very strong adhesion between the coating and the underlying mold tool material. Furthermore, while the use of such coatings have been shown to increase wearability of mold tools, there has been no demonstrated benefit from the perspective of cleaning.

Therefore, it is apparent that there is a need for an improved method for molding semiconductor devices and more particularly a method which will reduce surface friction between molding tools and molding compounds, as well as require less cleaning of the mold tool, and expand the mold tools useful life to be over that which is currently available.

DETAILED DESCRIPTION OF THE PRESENT INVENTION

Generally, the present invention provides an improved molding method and molding apparatus for encapsulating semiconductor devices in plastic. More specifically, in accordance with the present invention, the molding tool used to define the plastic package bodies of semiconductor devices includes modified surfaces which reduce the need to clean the mold (by lowering the coefficient of surface friction, thereby reducing adhesion to the molding compound) and increase the wearability and lifetime of the mold (by increasing the surface hardness of the mold).

The modified surface, or doped surface, is achieved by ion implantation, wherein species are implanted through the surface of the mold tool which will be in contact with the resin molding compound during the encapsulation process. Either chemically or physically, or through a combination of both, the implanted species interact with the mold tool material (typically a tool steel), to form a surface which has an improved properties mentioned above. Advantages of using an implantation process, as opposed to a coating process, is that there is no risk of delamination or peeling of the modified surface from the underlying mold tool material, and ion implantation is much more controllable and reproducible than a deposition process. The treatment of the mold tool surfaces by ion implantation leads to an easier release of the semiconductor devices because there is less friction, and hence reduced wettability, and a reduced surface contamination rate. Furthermore, the implanted surfaces are more resistant to wear than untreated mold tool surfaces, thereby extending the useful lifetime of the mold.

These and other features and advantages will be more clearly understood from the following detailed description taken in conjunction with the accompanying drawings. It is important to point out that the illustrations are not necessarily drawn to scale and that there are likely to be other embodiments of the present invention that are not specifically illustrated.

Figure 1:
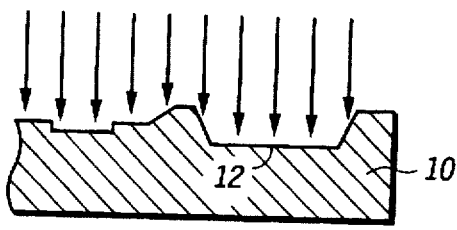
FIG. 1 is a cross-sectional illustration of a lower platen of a mold tool being implanted in accordance with the present invention.

FIG. 1 is a cross-sectional illustration of a lower platen 10 which will become part of a mold tool for making a semiconductor device in accordance wit the present invention. The bulk of platen 10 will typically be formed of a tool or stainless steel. Platen 10 includes a contact surface 12. Contact surface 12 is so called because this surface will come into contact with the resin molding compound used to form the plastic package of the semiconductor device. In accordance with the present invention, contact surface 12 is modified by ion implantation, as FIG. 1 represents. As a result of implanting, the implant species 14 will exist to a pre-determined depth beneath contact surface 12, thereby forming a modified surface 16 as illustrated in FIG. 2.

Implantation of species such as C, N, Ti, W, Ni, Au, Cr, Xe, Ar, Ne, and Al, at doses ranging from approximately $5 \times 10^{15}$ ions/cm$^2$ and higher and accelerating voltages from approximately 100 keV to 10 MeV (dependent on atomic specie), will result in the formation of non-equilibrium material phases in a shallow surface region of the material, typically less than 2.0 μm in depth. Within this affected region, depending on the mass and acceleration of the implanted ions, the material may become completely amorphized, partially amorphized, super-saturated, or develop precipitates of beneficial compounds such as carbides or nitrides. The end effect of all such interactions will be to create a surface region with reduced surface friction, decreased wettability, and increased hardness. Implantation as identified above can be carried out using processes known to one skilled in the field of ion beam modification of materials, such as modification of tool steels.

Figure 2:
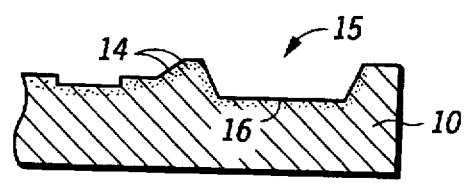
FIG. 2 is an illustration of the mold platen of FIG. 1 having a modified surface in accordance with the present invention.
Figure 7:
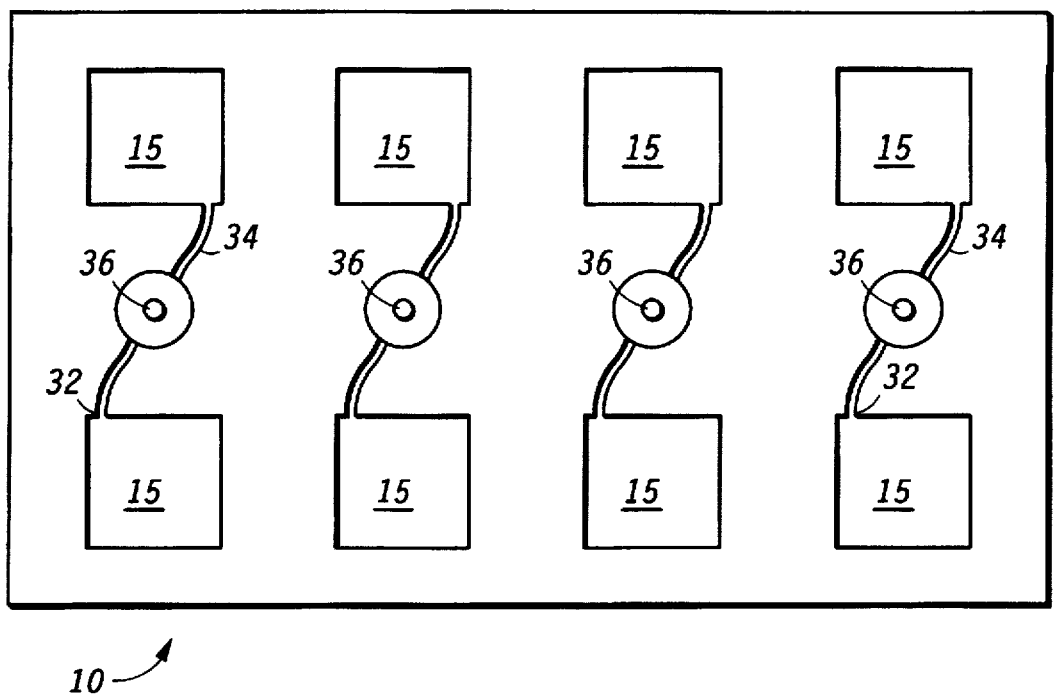
FIG. 7 is a top view of molding platen 10 illustrating a plurality of packaged cavities as they might be configured in a molding tool designed for a transfer molding operation.

As illustrated in FIGS. 1 and 2, implantation is performed such that at least those portions of the molding tool platens which will be in contact with the resin molding compound are modified. FIG. 7 illustrates a top view of lower platen 10 which is useful for describing those portions of the mold which should be modified. Lower platen 10 includes a plurality of package cavities 15 like the one illustrated in FIGS. 1 and 2. Although eight individual package cavities are illustrated, the number of package cavities used in a molding operation in accordance with the present invention is not restricted. Lower platen 10 also includes a plurality of pots 36 which are used to receive molding pellets as subsequently described. As illustrated, there is one pot 36 for two package cavities 15, however such is not a limitation of the present invention. Package cavities 15 are connected to pots 36 by means of a runner cavity 34. During the molding operation, resin molding compound is transferred from pots 36 through runners 34 and into package cavities 15 at a gate portion 32 of the mold platen. Portions of the mold platen 10 which should be implanted in accordance with the present invention are illustrated include package cavities 15, runners 34, and gate portions 32. Pots 36 need not be implanted. It is important to note that although selected portions of lower platen 10 are described as being implanted, it is possible that the entire surface of the lower mold platen be implanted.

In accordance with the present invention, both a lower and an upper mold platen of the mold tool are modified using ion implantation. After such modification has occurred, the mold tool can be used in a conventional manner. FIGS. 3–6 illustrate how a modified mold tool can be used in accordance with the present invention to encapsulate a semiconductor device.

Figure 3:
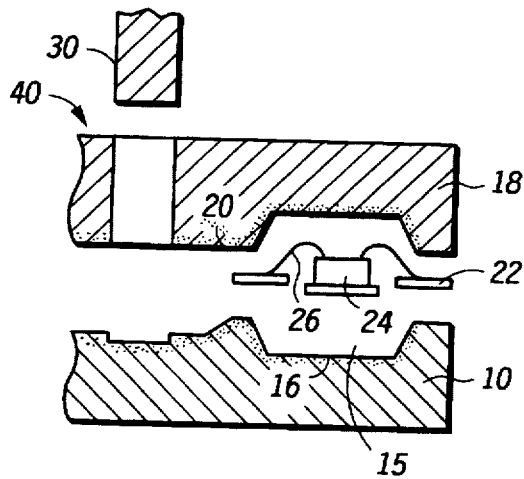
FIGS. 3 through 6 illustrate a method for using the mold tool illustrated in FIGS. 1 and 2 for encapsulating a semiconductor device with a resin molding compound.

FIG. 3 illustrates a mold tool 40 which includes a lower platen 10 having a modified surface 16, as described previously. Mold tool 40 also includes an upper platen 18 which has likewise been implanted to form a modified surface 20. In a preferred embodiment, modified surface 16 and modified surface 20 are formed in the same manner (for example using the same implant species at the same implant energies) to achieve as similar a surface as possible.

After providing the mold tool, a semiconductor die 24 is positioned within package cavity 15 of the mold tool. As illustrated in FIG. 3, semiconductor die 24 is mounted on a lead frame 22 and is electrically coupled to the lead frame by wire bonds 26. While use of a lead frame is herein illustrated, semiconductor die 24 may be positioned within the package cavity on any number of carrier substrates. For example, the die can be mounted to an organic substrate having a conductive wiring pattern, such as those used in plastic ball grid array packages. Furthermore, the die can simply be suspended within the package cavity by connection to the internal leads, such as in TAB (tape automated bonding) packages, and in flagless packages.

Figure 4:
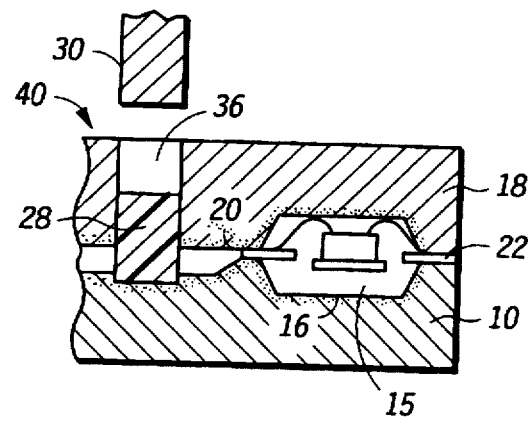
Figure 5:
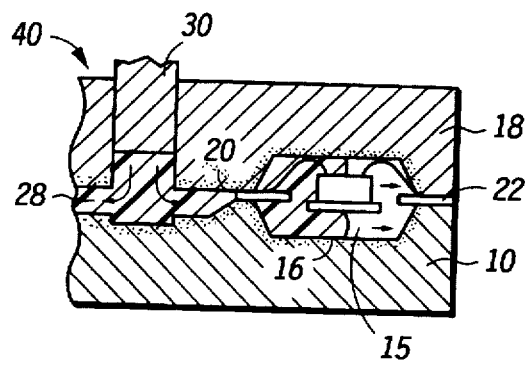
Figure 6:
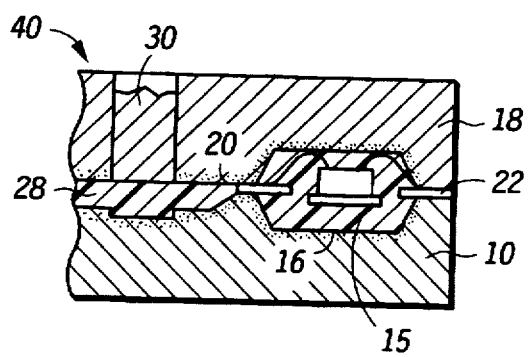

After the die is positioned within the package cavity, the upper and lower platens are brought together as illustrated in FIG. 4. A pellet of molding compound resin 28 is positioned within pot 36 of the mold tool. Any commercially available electronic grade molding compounds can be used in accordance with the present invention. Typically, the molding compound will be resin-based. Once pellet 28 is positioned within the molding tool, a plunger 30 presses against the pellet, causing the molding compound resin to flow from pot 36 through runner portion 34 and gate portion 32, into the package cavity as illustrated in FIG. 5. The transformation of the molding compound resin from a solid pellet form to a fluid form to achieve flow occurs as a combination of heating the molding tool and exerting pressure on the material through use of the plunger, as is done in conventional molding operations. As illustrated in FIG. 5 the molding compound resin flows from one edge or corner of the package cavity to the opposing edge or corner, until completely filling the cavity as illustrated in FIG. 6.

After encapsulation is complete, the molding compound is at least minimally cured and the devices are removed from the mold tool for subsequent processing. Such subsequent processing can include singulation of the semiconductor device from a strip form and formation of the external leads (in the case of using a metal lead frame) or the attachment of external conductive terminals (for example attachment of solder balls in the case of forming a plastic ball grid array from an organic substrate).

The foregoing description and illustrations contained herein contain many advantages associated with the present invention. In particular, it has been revealed that by implanting the contact surface of a molding tool, surface friction of the molding tool is reduced. As a result, the surface is less susceptible to contamination, thereby requiring less frequent cleaning. As such, the mold tool can be used with minimal downtime and maximal throughput. The implanted surfaces also exhibit reduced adhesion to plastic compounds, allowing for easier release of the molded package. A further benefit of the present invention is that the useful lifetime of a molding tool is extended due to the increased hardness of the implanted surface which results in less wear over time. Moreover, use of ion implantation to modify the mold tool surface has no impact on the final physical dimensions of the object which is being molded. Nor is there a susceptibility of the modified surface delaminating from the underlying mold tool material as may occur with deposited materials.

Thus, it is apparent that there has been provided in accordance with the invention a method for molding using an implanted mold that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to the implantation of a particular species into the mold surface. Nor is the invention limited to a particular interaction (be it chemical or physical) between the implanted species and the underlying mold tool material. In addition, the invention is not limited to the type or configuration of the semiconductor device being molded. J-leaded, gull-wing leaded, in-line leaded, and leadless packages can be made in accordance with the present invention. Moreover, leads can be formed of conductive balls or columns. Nor is the invention limited to encapsulating devices on lead frames, but rather extends to any plastic encapsulated device which is made with a molding operation. Furthermore, the present invention is not limited to transfer molding of thermoset materials. The benefits of the invention can be realized using an injection molding process, and with thermoplastic materials as well. Therefore it is intended that this invention encompass all such variations and modifications as fall within the scope of the appended claims.

I claim:

1. A method for molding a semiconductor device comprising:

providing a mold tool having a cavity which defines the semiconductor device to be molded, wherein the mold tool comprises a first platen having a first surface, wherein a portion of the first surface has been modified by ion implantation to form a first modified surface, and wherein the first surface comprises a contact area and a non-contact area, and the contact area is in contact with the molding compound during the step of filling, and at least a portion of the contact area has been modified by ion implantation to form the first modified surface, and the cavity of the first platen comprises a runner portion and a package portion, and wherein the contact area comprises the runner portion and the package portion of the cavity;

providing a semiconductor element;

positioning the semiconductor element within the cavity of the mold tool;

providing a molding compound; and filling the cavity of the mold tool with the molding compound.

2. The method of claim 1, wherein the step of providing a mold tool comprises providing a mold tool further having a second platen having a second surface, wherein a portion of the second surface has been modified by ion implantation to form a second modified surface.

3. The method of claim 1, wherein the step of providing a semiconductor element comprises:

providing a semiconductor die;

providing a carrier; and providing an electrical connection between the carrier and the semiconductor die.

4. The method of claim 1, wherein the step of providing a molding compound comprises providing a resin-based molding compound.

5. A method for molding a semiconductor device comprising:

providing a mold tool having a cavity which defines the semiconductor device to be molded, wherein the mold tool comprises a first platen having a first surface, wherein a portion of the first surface has been modified by ion implantation to form a first modified surface, and wherein the first surface comprises a contact area and a non-contact area, and the contact area is in contact with the molding compound during the step of filling, and at least a portion of the contact area has been modified by ion implantation to form the first modified surface, and the cavity of the first platen comprises a runner portion and a package portion, and substantially all of the contact area has been modified by ion implantation to form the first modified surface;

providing a semiconductor element;

positioning the semiconductor element within the cavity of the mold tool;

providing a molding compound; and filling the cavity of the mold tool with the molding compound.

6. The method of claim 5, wherein the step of providing a mold tool comprises providing a mold tool having a second platen having a second surface wherein the second surface comprises a contact area and a non-contact area, wherein the contact area contacts the molding compound, and at least a portion of the contact area has been modified by ion implantation to form the first modified surface.

7. The method of claim 1, wherein substantially all of the first surface has been modified by ion implantation to form the first modified surface.

8. A method for molding a semiconductor device comprising the steps of:

providing a semiconductor die;

providing a molding tool having a lower platen and an upper platen, at least one platen having a package cavity formed in a surface thereof, and wherein the package cavity has a doped surface to reduce surface friction, and at least one platen has a runner cavity connected to the package cavity during the step of introducing, and the runner cavity also has a doped surface to reduce surface friction;

positioning the semiconductor die in the molding tool such that the semiconductor die is within the package cavity;

bringing the lower platen and the upper platen together;

introducing a molding compound into the package cavity and in contact with the doped surface to form a plastic package body which encapsulates the semiconductor die; and removing the plastic package body from the molding tool.

9. The method of claim 8 wherein the step of providing a molding tool comprises providing a molding tool having a surface friction coefficient of at least approximately half of a surface friction coefficient of a surface of a similar mold surface that has not been implanted.

10. A method for molding a semiconductor device comprising the steps of:

providing a semiconductor die;

providing a molding tool having a lower platen and an upper platen, at least one platen having a package cavity formed in a surface thereof, and wherein the package cavity has a doped surface to reduce surface friction, wherein the doped surface is an ion implanted surface, and the ion implanted surface includes an implant species of (nickel) Ni;

positioning the semiconductor die in the molding tool such that the semiconductor die is within the package cavity;

bringing the lower platen and the upper platen together;

introducing a molding compound into the package cavity and in contact with the doped surface to form a plastic package body which encapsulates the semiconductor die; and removing the plastic package body from the molding tool.

11. The method of claim 10 wherein the step of providing a molding tool comprises providing a molding tool wherein the ion implanted surface includes an implant species implanted to a depth of at most two micron from the surface.

12. A method for molding a semiconductor device comprising the steps of:

providing a semiconductor die;

providing a molding tool having a lower platen and an upper platen, at least one platen having a package cavity formed in a surface thereof, and wherein the package cavity has a doped surface to reduce surface friction, wherein the doped surface is an ion implanted surface, and the ion implanted surface includes an implant species of (tungsten) W;

positioning the semiconductor die in the molding tool such that the semiconductor die is within the package cavity;

bringing the lower platen and the upper platen together;

introducing a molding compound into the package cavity and in contact with the doped surface to form a plastic package body which encapsulates the semiconductor die; and removing the plastic package body from the molding tool.

13. The method of claim 12 wherein the step of providing a molding tool comprises providing a molding tool wherein the ion implanted surface includes an implant species implanted to a depth of at most two micron from the surface.

14. A method for molding a semiconductor device comprising the steps of:

providing a semiconductor die;

providing a molding tool having a lower platen and an upper platen, at least one platen having a package cavity formed in a surface thereof, and wherein the package cavity has a doped surface to reduce surface friction, wherein the doped surface is an ion implanted surface, and the ion implanted surface includes an implant species of (titanium) Ti;

positioning the semiconductor die in the molding tool such that the semiconductor die is within the package cavity;

bringing the lower platen and the upper platen together;

introducing a molding compound into the package cavity and in contact with the doped surface to form a plastic package body which encapsulates the semiconductor die; and removing the plastic package body from the molding tool.

15. The method of claim 14 wherein the step of providing a molding tool comprises providing a molding tool wherein the ion implanted surface includes an implant species implanted to a depth of at most two micron from the surface.

* * * * *